(12) United States Patent
Grasse et al.

(10) Patent No.: US 11,328,831 B2
(45) Date of Patent: May 10, 2022

(54) METHOD FOR TREATING A REFLECTIVE OPTICAL ELEMENT FOR THE EUV WAVELENGTH RANGE, METHOD FOR PRODUCING SAME, AND TREATING APPARATUS

(71) Applicant: Carl Zeiss SMT GmbH, Oberkochen (DE)

(72) Inventors: Christian Grasse, Garching (DE); Martin Hermann, Heidenheim (DE); Stephan Six, Augsburg (DE); Joern Weber, Aalen (DE); Ralf Winter, Schwaebisch Gmuend (DE); Oliver Dier, Lauchheim (DE); Vitaliy Shklover, Heidenheim (DE); Kerstin Hild, Schwaebisch Gmuend (DE); Sebastian Strobel, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 73 days.

(21) Appl. No.: 16/050,541

(22) Filed: Jul. 31, 2018

(65) Prior Publication Data

US 2019/0035512 A1 Jan. 31, 2019

(30) Foreign Application Priority Data

Jul. 31, 2017 (DE) .......................... 102017213168.3

(51) Int. Cl.
*G21K 1/06* (2006.01)
*G02B 5/08* (2006.01)
(Continued)

(52) U.S. Cl.
CPC .............. *G21K 1/062* (2013.01); *G02B 1/10* (2013.01); *G02B 1/12* (2013.01); *G02B 5/0891* (2013.01);
(Continued)

(58) Field of Classification Search
CPC ..... G03F 1/22; G03F 1/24; G03F 1/52; G03F 7/70958; G03F 7/7015; G02B 1/12;
(Continued)

(56) References Cited

U.S. PATENT DOCUMENTS 6,309,705 B1 10/2001 Montcalm et al.
6,770,143 B2 8/2004 Zhang et al.
(Continued)

FOREIGN PATENT DOCUMENTS

DE 102004002764 A1 6/2004
DE 102007052782 A1 5/2009
(Continued)

OTHER PUBLICATIONS

W. Lerch et al., "Advanced activation trends for boron and arsenic by combinations of single, multiple flash anneals and spike rapid thermal annealing", Materials Science and Engineering B 154-155, 2008, pp. 3-13.

(Continued)

*Primary Examiner* — Dah-Wei D. Yuan
*Assistant Examiner* — Nga Leung V Law
(74) *Attorney, Agent, or Firm* — Edell, Shapiro & Finnan, LLC

(57) ABSTRACT

Treating a reflective optical element (104) for the EUV wavelength range that has a reflective coating on a substrate. The reflective optical element in a holder (106) is irradiated with at least one radiation pulse of a radiation source (102) having a duration of between 1 μs and 1 s. At least one radiation source (102) and the reflective optical element move relative to one another. Preferably, this is carried out directly after applying the reflective coating in a coating chamber (100). Reflective optical elements of this type are suitable in particular for use in EUV lithography or in EUV inspection of masks or wafers, for example.

16 Claims, 5 Drawing Sheets

(51) Int. Cl.
*G03F 7/20* (2006.01)
*G02B 1/10* (2015.01)
*G03F 1/24* (2012.01)
*G03F 1/52* (2012.01)
*G02B 1/12* (2006.01)

(52) U.S. Cl.
CPC ................. *G03F 1/24* (2013.01); *G03F 1/52* (2013.01); *G03F 7/7015* (2013.01); *G03F 7/70958* (2013.01)

(58) Field of Classification Search
CPC .......... G02B 1/10; G02B 5/0891; B05D 3/02; B05D 3/0254; B05D 3/06; B05D 3/061; B05D 3/065; B05D 3/066; G21K 1/062
See application file for complete search history.

(56) References Cited

U.S. PATENT DOCUMENTS

| | | | | |
|---|---|---|---|---|
| 6,844,272 | B2* | 1/2005 | Taylor | B82Y 10/00 438/787 |
| 6,984,475 | B1* | 1/2006 | Levinson | B82Y 10/00 430/5 |
| 7,471,455 | B2 | 12/2008 | Das et al. | |
| 7,760,433 | B2 | 7/2010 | Yamazaki et al. | |
| 10,033,152 | B1* | 7/2018 | Nagarkar | C23C 14/221 |
| 2003/0152756 | A1* | 8/2003 | Yamada | B23K 26/066 428/210 |
| 2007/0166965 | A1* | 7/2007 | Tanaka | B23K 26/0604 438/487 |
| 2010/0068632 | A1* | 3/2010 | Ono | B82Y 10/00 430/5 |
| 2011/0177746 | A1* | 7/2011 | Voronov | B23K 26/073 445/25 |
| 2011/0228234 | A1* | 9/2011 | Von Blanckenhagen | B82Y 10/00 353/98 |
| 2013/0122404 | A1 | 5/2013 | Park et al. | |
| 2014/0076867 | A1* | 3/2014 | Kim | G02B 27/0927 219/121.65 |
| 2014/0212794 | A1* | 7/2014 | Maeshige | B82Y 40/00 430/5 |
| 2014/0272682 | A1* | 9/2014 | Shih | G03F 1/22 430/5 |
| 2014/0307308 | A1 | 10/2014 | Weiss et al. | |
| 2015/0056742 | A1* | 2/2015 | Rana | H01L 31/022441 438/71 |

FOREIGN PATENT DOCUMENTS

| | | |
|---|---|---|
| DE | 102010003885 A1 | 6/2011 |
| DE | 102011084117 A1 | 4/2013 |
| DE | 102012215359 A1 | 3/2014 |
| WO | 2007122061 A1 | 11/2007 |
| WO | 2008128781 A1 | 10/2008 |

OTHER PUBLICATIONS

L.P. Cook et al., "Enhanced mass transport in ultrarapidly heated Ni/Si thin-film multilayers", Journal of Applied Physics 106, 104909, 2009, 7 pages.

W. Skorupa et al., "Advanced thermal processing of semiconductor materials in the millisecond range", Vacuum 78, 2005, pp. 673-677.

Office Action in corresponding German Application 102017213168.3, dated Feb. 23, 2018, along with English Translation.

European Search Report, EP18183568.7, dated Nov. 30, 2018, 8 pages.

* cited by examiner

METHOD FOR TREATING A REFLECTIVE OPTICAL ELEMENT FOR THE EUV WAVELENGTH RANGE, METHOD FOR PRODUCING SAME, AND TREATING APPARATUS

CROSS REFERENCE TO RELATED APPLICATIONS

The present application claims the priority of German Patent Application 10 2017 213 168.3 of 31 Jul. 2017, the disclosure of which is hereby incorporated into the present application by reference in its entirety.

FIELD OF THE INVENTION

The present invention relates to a method for treating a reflective optical element for the EUV wavelength range comprising a reflective coating on a substrate, and to a method for producing a reflective optical element for the EUV wavelength range comprising a reflective coating on a substrate. Furthermore, the invention relates to an apparatus for treating reflective optical elements for the EUV wavelength range.

BACKGROUND

In EUV lithography apparatuses, reflective optical elements for the extreme ultraviolet (EUV) wavelength range (e.g. wave lengths of between approximately 5 nm and 20 nm) such as, for instance masks or mirrors on the basis of multilayer systems are used for the lithography of semiconductor components. Since EUV lithography apparatuses generally comprise a plurality of reflective optical elements, the latter should have the highest possible reflectivity in order to ensure a sufficiently high total reflectivity. Moreover, reflective optical elements for the EUV wavelength range are used in systems for inspecting masks and/or wafers, in particular.

Reflective optical elements for the EUV wavelength range generally comprise multilayer systems as reflective coating. This involves alternatingly applied layers of a material having a higher real part of the refractive index at the operating wavelength (also called "spacer") and of a material having a lower real part of the refractive index at the operating wavelength (also called "absorber"), wherein an absorber-spacer pair forms a stack or a period. In certain respects a crystal is thereby simulated whose lattice planes correspond to the absorber layers at which Bragg reflection takes place. The operating wavelength ideally corresponds to the wavelength of maximum peak reflectivity. At a specific angle of incidence the wavelength with maximum peak reflectivity can be set in particular by way of the thickness of the stack or the period. The thicknesses of the individual layers and also of the repeating stacks can be constant over the entire multilayer system or else vary, depending on what reflection profile is intended to be achieved.

Upon the start-up of operation of the lithography or inspection process, the reflective optical elements heat up as a result of the impinging radiation, which leads to a densification and thus compaction of the individual layers of the reflective coating. This results in a change in the wavelength of the reflectivity maximum and the so-called mirror figure, which can lead to a loss of reflectivity and wave front aberrations. Furthermore, the layer stress in the reflective coating can change, which can lead to deformations and thus likewise to imaging aberrations.

DE 10 2004 002 764 A1 discloses, when applying the reflective coating of a reflective optical element for the EUV wavelength range, providing an oversize for each layer and heat treating the reflective optical element after the topmost layer has been applied. This process is carried out at temperatures of between approximately 55° C. and approximately 115° C., preferably between approximately 60° C. and approximately 85° C., and can last between approximately 12 hours and approximately 36 hours.

SUMMARY

It is an object of the present invention to specify a further method for treating a reflective optical element for the EUV wavelength range.

This object is achieved by a method for treating a reflective optical element for the EUV wavelength range comprising a reflective coating on a substrate, wherein the reflective optical element is irradiated with at least one radiation pulse having a duration of between 1 µs and 1 s, preferably a duration of between 100 µs and 5 ms, wherein irradiation is carried out by at least one radiation source and the at least one radiation source and the reflective optical element perform a relative movement with respect to one another.

It has been found that what can be achieved by irradiating reflective optical elements for the EUV wavelength range with extremely short pulses is that ageing from the start-up of, for example, an EUV lithography apparatus or an EUV inspection system comprising such reflective optical elements can be anticipated in a targeted manner by the irradiation and undesired ageing processes during lithography or inspection operation can thus be reduced. Performing a relative movement between the at least one radiation source and the reflective optical element enables the treating to be controlled in a more targeted manner in order for instance to improve the homogeneity of the density change and/or relaxation process over the entire area of the reflective coating or to locally correct figure aberrations present, for instance. In particular, radiation sources operated continuously over time can also be used in order to subject area units only briefly to the treating radiation. The treating can be carried out more rapidly and more precisely in comparison with the procedure known heretofore.

Ageing processes should be understood to mean density changes that may be based on densification of the individual layers compared with the state directly after the coating, and also density changes that may be based on structural changes on account of interdiffusion at the layer boundaries and may lead to a densification or expansion depending on the material composition. Furthermore, ageing processes should be understood to mean layer stresses in the reflective coating which change over the operating time and which can lead to figure deformations. Relaxation processes that anneal layer defects, for instance, can be triggered by the short-pulse irradiation.

Irradiation with at least one radiation pulse is understood to mean that an irradiated area unit is impinged on by radiation over in each case a short irradiation duration of between 1 µs and 1 s. This can be achieved, inter alia, by pulsed operation of a radiation source, movement of a beam spot over an area to be irradiated and/or shading of the radiation.

It has been found to be advantageous if the relative movement is performed as at least one linear movement or at least one rotational movement or a superimposition of at least one linear movement and at least one rotational movement.

Preferably, in these embodiments, the radiation source is operated with varying power depending on the relative movement. As a result, the energy input into the reflective coating can be varied locally. In particular, reflective optical elements having arbitrary surface profiles can thus be treated in a more targeted manner.

Advantageously, the relative movement is performed with a linear component having a velocity of between 1 and 600 cm/s, preferably 5 cm/s and 400 cm/s, particularly preferably 10 cm/s and 200 cm/s. This allows even relatively large reflective optical elements such as, for instance, EUV mirrors having substrate diameters in the range of tens of centimetres to be treated very rapidly and yet in a targeted manner in order to artificially age them. Smaller beam spots can likewise be employed at higher velocities.

Advantageously, the at least one radiation pulse is directed onto the reflective coating. In this way, the energy input resulting from the at least one radiation pulse can be used particularly efficiently for the density change of the reflective coating and/or for the relaxation of layer stresses. Moreover, the dissipation of heat into the substrate is reduced by an irradiation in the short-pulse mode, which makes it possible to prevent a macroscopic heating of the substrate that could otherwise lead to undesired deformations of the substrate.

Preferably, irradiation is carried out at a wavelength in the range of between 160 nm and 2000 nm, preferably between 200 nm and 1100 nm, particularly preferably between 800 nm and 1100 nm. Particularly if the reflective optical element is mounted in a holder during the irradiation, the wavelengths of the radiation can be chosen such that it is largely absorbed by the reflective coating and predominantly reflected by the holder. In this regard, an undesired heating of the holder and of the substrate can be avoided.

It has proved to be advantageous to irradiate the reflective optical element with at least one radiation pulse having an energy density of between 0.01 J/cm$^2$ and 15 J/cm$^2$, preferably between 0.05 J/cm$^2$ and 10 J/cm$^2$, particularly preferably between 1 J/cm$^2$ and 5 J/cm$^2$. Particularly in conjunction with the pulse duration, wavelengths and pulse frequencies indicated above, in this way energy magnitudes can be input into the reflective layer which lead to a relaxation of layer stresses and/or a density change, without leading to relatively large structural changes such as, for instance, on account of melting of the layers or destruction of the reflective coating. Energy densities of between approximately 0.01 J/cm$^2$ and approximately 5 J/cm$^2$ are suitable particularly for stress relaxation, and energy densities of between approximately 1 J/cm$^2$ and approximately 15 J/cm$^2$ are suitable particularly for density changes, in particular densification of the individual layers.

In a further aspect, the object is achieved by a method for producing a reflective optical element for the EUV wavelength range comprising a reflective coating on a substrate, comprising the following steps:

coating the substrate;

treating the coated substrate as described above.

It has been found that the best results are achieved if reflective optical elements for the EUV wavelength range are treated as far as possible not too long after the coating process and before incorporation into an EUV lithography apparatus, for example, in order to achieve a density change and/or a relaxation of the layer stress.

In preferred embodiments, coating the substrate is performed in a coating chamber and afterward the treating as described above by irradiation with at least one short radiation pulse is also performed in said coating chamber. In this regard, it is possible to minimize impairments of the reflective coating that could lead to imaging aberrations or a shortening of the lifetime, for instance between the two steps.

Advantageously, both the coating and the treating by short-pulse irradiation, for instance, are carried out under vacuum or protective atmosphere. Particularly if the treating is additionally carried out in situ in the coating chamber, it is thus possible to avoid oxidation effects at the surface of the reflective coating such as can occur for example in the case of vacuum interruptions.

Particularly preferably, the treating is carried out directly after the coating. As a result, it is possible to reduce the production outlay in particular in respect of time, and at the same time to ensure a high quality and good reproducibility of the reflective optical elements produced in this way.

In a further aspect, said object is achieved by an apparatus for treating reflective optical elements for the EUV wavelength range, comprising a holder for mounting a reflective optical element and at least one radiation source, wherein the holder and/or the at least one radiation source comprise at least one linear drive and/or rotary drive.

An apparatus of this type is particularly well suited to carrying out the treatment on the basis of short-pulse irradiation of reflective optical elements for the EUV wavelength range, as was proposed above. By the at least one linear drive and/or rotary drive, the treatment can be controlled in a more targeted manner in order for instance to improve the homogeneity of the density change and/or relaxation process over the entire area of the reflective coating or to locally correct figure aberrations present, for instance. In particular, reflective optical elements having arbitrary surface profiles can thus be treated in a more targeted manner.

In preferred embodiments, the holder and the at least one radiation source are arranged in one chamber. This makes it possible to carry out the radiation treatment directly after the coating of the reflective optical element and without vacuum interruption, such that the risk of an impairment of the reflective coating for example by oxidation can be minimized.

Preferably, the radiation source is configured as at least one flash tube and/or at least one laser. These radiation sources can be operated in a pulsed manner with pulse durations in particular in the microseconds to subseconds range. Moreover, radiation sources of this type are available which emit, inter alia, in the wavelength range of 160 nm to 2000 nm and in particular in the range of 200 nm to 1100 nm. Furthermore, they can also be operated with high repetition rates and are available for operation with an energy density of between 0.01 J/cm$^2$ and 15 J/cm$^2$. Flash tubes are based on radiation emission on account of gas discharge. Flash tubes on the basis of noble gases are particularly preferred. In the case of the lasers, particularly diode lasers and solid-state lasers are preferred.

BRIEF DESCRIPTION OF THE DRAWINGS

The present invention will be explained in more detail with reference to preferred exemplary embodiments. In the figures.

DETAILED DESCRIPTION

Figure 1:
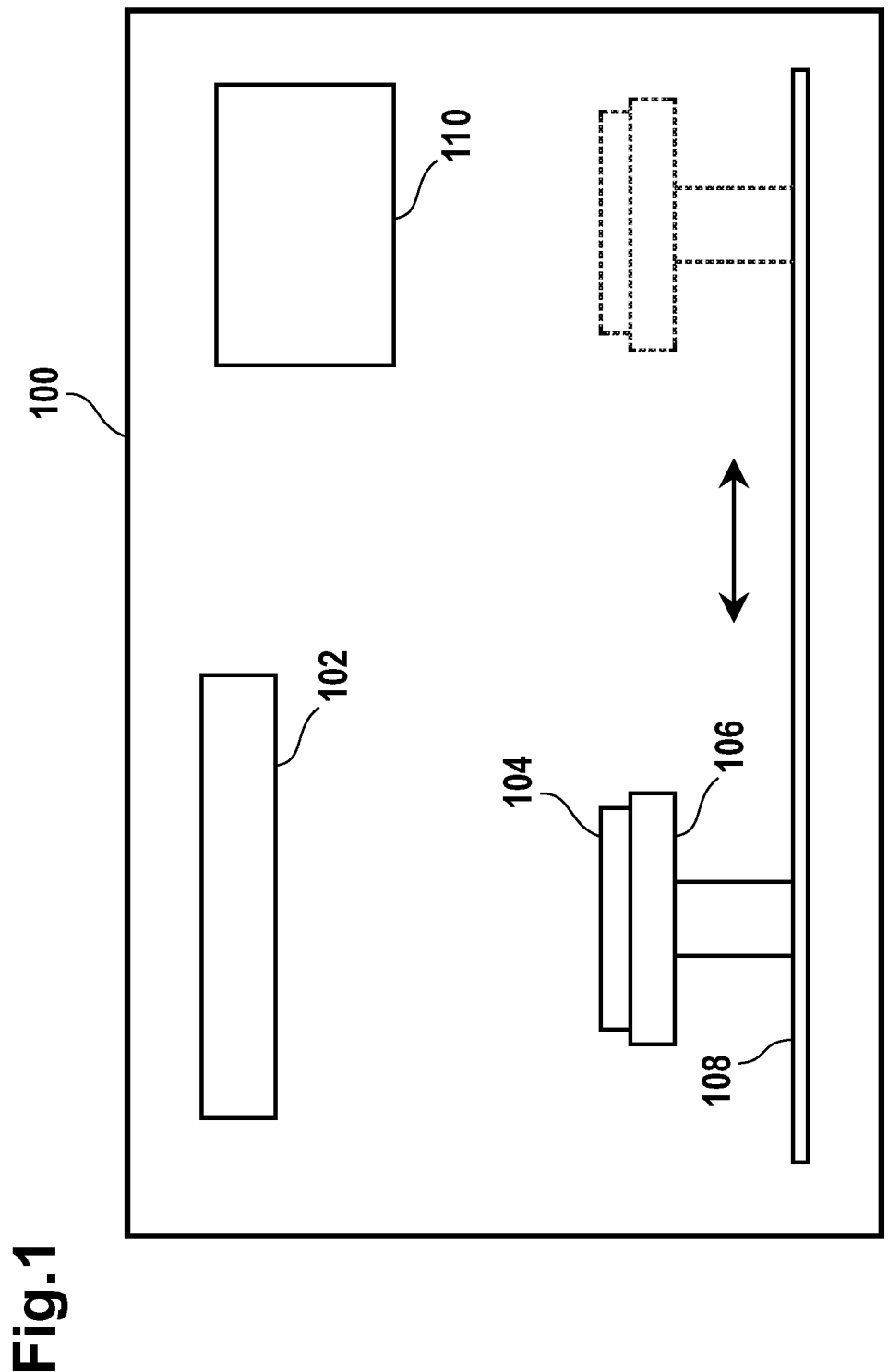
FIG. 1 shows a schematic view of a coating chamber with an apparatus for treating a reflective optical element for the EUV wavelength range.

FIG. 1 illustrates a schematic view of a coating chamber 100 with an apparatus for treating a reflective optical element 104 for the EUV wavelength range. The apparatus comprises a holder 106, in which the reflective optical element 104 is mounted, and a radiation source 102, which are arranged in the coating chamber 100. In the example illustrated here, the holder 106 is provided with a linear drive 108, with the aid of which the holder 106 with the reflective optical element 104 can be linearly moved relative to the radiation source 102 in particular during short-pulse irradiation in order to be able to ensure for instance that the reflective coating of the reflective optical element 104 is treated as homogeneously as possible. In further examples not shown, the apparatus comprises at least one rotary drive instead of or in addition to the linear drive. The apparatus may also comprise more than one linear drives, eventually in combination with one or more rotary drives.

Since holder 106 and radiation source 102 are arranged in the coating chamber 100, the short-pulse treatment can be carried out directly after the coating process by the coating device 110. The coating process is preferably carried out under vacuum, particularly if physical deposition methods such as, for instance, sputtering methods or electron beam evaporation are involved. In the method illustrated here, the linear drive 108 can be used to move the holder 106 with coated reflective optical element 104 from a coating position below the coating device 110 into an ageing position below the radiation source 102. In other variants, both positions could also be spatially identical and the radiation source 102 could be positioned by mechanical aids, for example, such that at least one radiation pulse is directed from said radiation source onto the previously applied reflective coating of the reflective optical element, or the coating device 110 is removed or shielded. Specifically, it is possible to use devices for homogenizing the coating process, for instance drives and mask arrangements, in order also to homogenize the radiation treatment over the area of the reflective coating. By virtue of the treatment by very short irradiation pulses also likewise being carried out in vacuum, the risk of contamination of the reflective coating by particles or oxidation can be reduced. In further variants, the irradiation treatment can also be carried out under protective atmosphere, for example on the basis of noble gas or other inert gases such as nitrogen.

Figure 2:
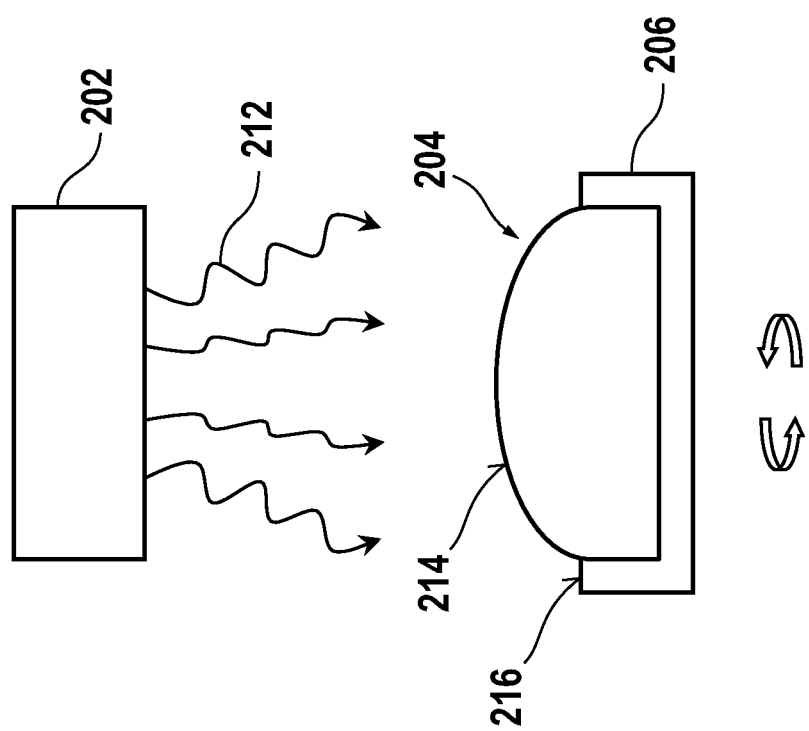
FIG. 2 schematically shows a first embodiment of the apparatus from FIG. 1.

FIG. 2 schematically illustrates a first embodiment of an apparatus for treating reflective optical elements for the EUV wavelength range with short-pulse irradiation. It can for example be arranged within a coating chamber or be situated by itself. Preferably, even then it is arranged in a chamber in order to carry out the irradiation under vacuum conditions or protective gas atmosphere. The apparatus comprises a radiation source 202 and a holder 206, in which an EUV mirror 204 is arranged, the reflective coating 214 of which is intended to be treated. In order to carry out the treatment, the EUV mirror 204 is irradiated with at least one radiation pulse having a duration of between 1 μs and 1 s, wherein the at least one radiation pulse is directed onto the reflective coating 214. During the irradiation, the holder 206 performs a rotational movement by a rotary drive (not illustrated), such that radiation source 202 and EUV mirror 204 perform a relative movement with respect to one another, which can contribute in particular to increasing the homogeneity of the density change and/or relaxation over the entire area of the reflective coating 214. By way of example, the rotational movement can be continuous or be synchronized with the repetition rate in the case of more than one radiation pulse, such that the area assumes a different position for each pulse. If e.g. the entire area of the reflective coating 214 is irradiated during each pulse, then it is possible to average out intensity fluctuations over the area.

In the case of particularly large reflective optical elements, the relative movement can have at least one linear component, if appropriate in addition to one or more rotational components, in order to be able to irradiate the entire area of the reflective coating as homogeneously as possible. In this case, a different partial area of the reflective coating can be irradiated during each pulse.

In the example illustrated in FIG. 2, a flash tube, preferably on the basis of xenon or krypton is used as the radiation source 202. If they are operated at power densities of approximately 3000 W/cm$^2$, they emit in particular a line spectrum in the range of approximately 800 nm to 1000 nm for krypton flash lamps or approximately 900 nm to 1100 nm for xenon flash lamps. If they are operated for example at a triple power density, they emit a continuous spectrum of from approximately 160 nm to 200 nm high up to approximately 1000 nm to 1100 nm. In the example illustrated here, they are operated with pulse durations of between 100 μs and 500 μs and energy densities of between approximately 0.01 J/cm$^2$ and approximately 15 J/cm$^2$. This corresponds to an energy input per pulse into the reflective coating 214 which corresponds to temperatures of between approximately 200° C. and 1500° C. Depending on the constitution of the reflective coating 214 and the desired compaction or stress relaxation, one, a plurality or a multiplicity of pulses can be employed. In this case, the repetition rates in the example illustrated here are between approximately 0.1 Hz and 1000 Hz, if irradiation is carried out using more than one radiation pulse. The wavelength range and the energy density of the radiation 212 are also advantageously coordinated with the constitution of the reflective coating 214 and the desired density change and/or relaxation. When choosing the wavelength range, it is additionally advantageous also to take account of the material of the holder 206. Since at least the holder surface 216 may likewise be exposed to the radiation 212, wavelength ranges are preferred in which the holder material has a high reflection rate, while the reflective coating 214 has a high absorption rate. If what is involved is for example a reflective coating 214 on the basis of a molybdenum-silicon multilayer system, such as is widely used for reflective optical elements for EUV lithography or EUV inspection, and a metallic holder, preferably composed of high-grade steel and particularly preferably composed of aluminium, a wavelength range of between approximately 800 nm and 1100 nm is well suited.

Figure 3B:
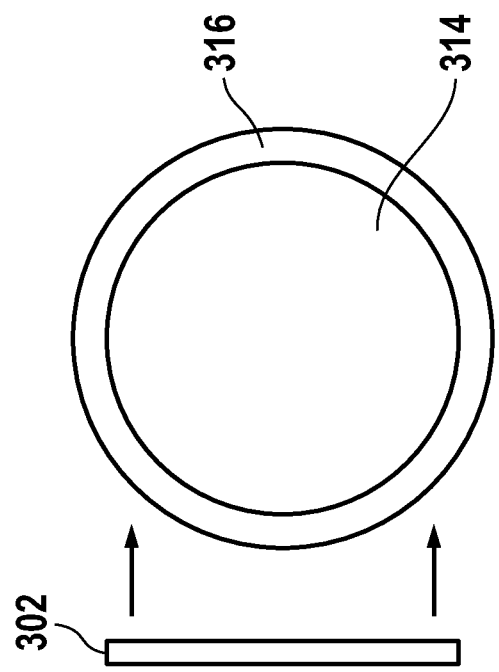
FIG. 3B schematically shows a second embodiment of the apparatus from FIG. 1 in plan view rotated by 90°.
Figure 3A:
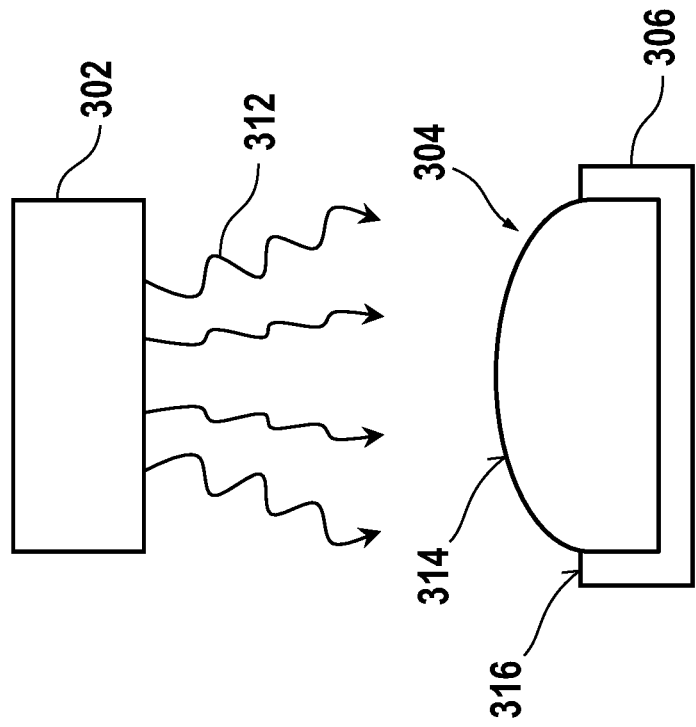
FIG. 3A schematically shows a second embodiment of the apparatus from FIG. 1 in side view.

In the exemplary embodiment illustrated in FIGS. 3A and 3B of an apparatus for artificial ageing comprising radiation source 302 and holder 306 for receiving an EUV mirror 304, the radiation source 302 is configured as a linear arrangement of a plurality of lasers (see plan view in FIG. 3B). This laser arrangement 302 performs a linear movement relative to the EUV mirror 304 by a linear drive (not illustrated). In this way the laser arrangement 302 moves across the reflective coating 314 to be compacted in one direction. Variants that are not illustrated can also involve, inter alia, one or a few lasers, the beam spot of which is correspondingly fanned out, or one laser or a plurality of lasers by which the reflective coating to be irradiated is scanned over the entire area thereof, by two linear drives for respectively different directions, for example. The lasers used can have a wavelength of the emitted radiation 312 of between approximately 160 nm and approximately 2000 nm. Higher wavelengths are rather unsuitable in particular with regard to metallic holders 306, which would absorb too much heat in particular via the holder surface 316 facing the laser arrangement 302 and could thus bring about macroscopic deformations and/or additional stresses in the EUV mirror 304.

In the example illustrated here, lasers are used which have a radiation spot size of between approximately 1 $mm^2$ and approximately 1 $cm^2$, are operated at a power of approximately 5 W to approximately 500 W per laser and can pass through 1 to 1000 cycles in pulsed operation, at repetition rates of approximately 0.1 Hz to 1000 Hz. In the present example, the laser arrangement 302 can be moved at a velocity of approximately 5 cm/s to 500 cm/s, preferably 10 cm/s to 200 cm/s. The velocity is preferably adapted to the current beam spot size, the area size of the reflective coating 314, the pulse length, the laser power and to the constitution of the reflective coating 314 and the desired ageing process. At very high repetition rates, for the coordination of the individual parameters it is possible to take account of an effective pulse length as a measure of how long the radiation spot stays on a partial area of comparable size of the reflective coating 314. On account of the curved surface of the EUV mirror 304 it is moreover particularly advantageous, in a manner synchronized with the velocity of the laser arrangement 302 and the relative position of the individual lasers of the arrangement relative to the reflective coating 314, to adapt the power of the individual lasers, for example to set the power to be lower in the case of a relatively small distance with respect to the area of the reflective coating 314 currently being acquired by the beam spots, and higher in the case of a relatively large distance, in order to achieve as homogenous ageing as possible. Particularly preferred types of laser are solid-state lasers and diode lasers, in particular surface emitters such as so-called VCSEL (vertical cavity surface emitting laser) and VECSEL (vertical external cavity surface emitting laser).

Figure 4:
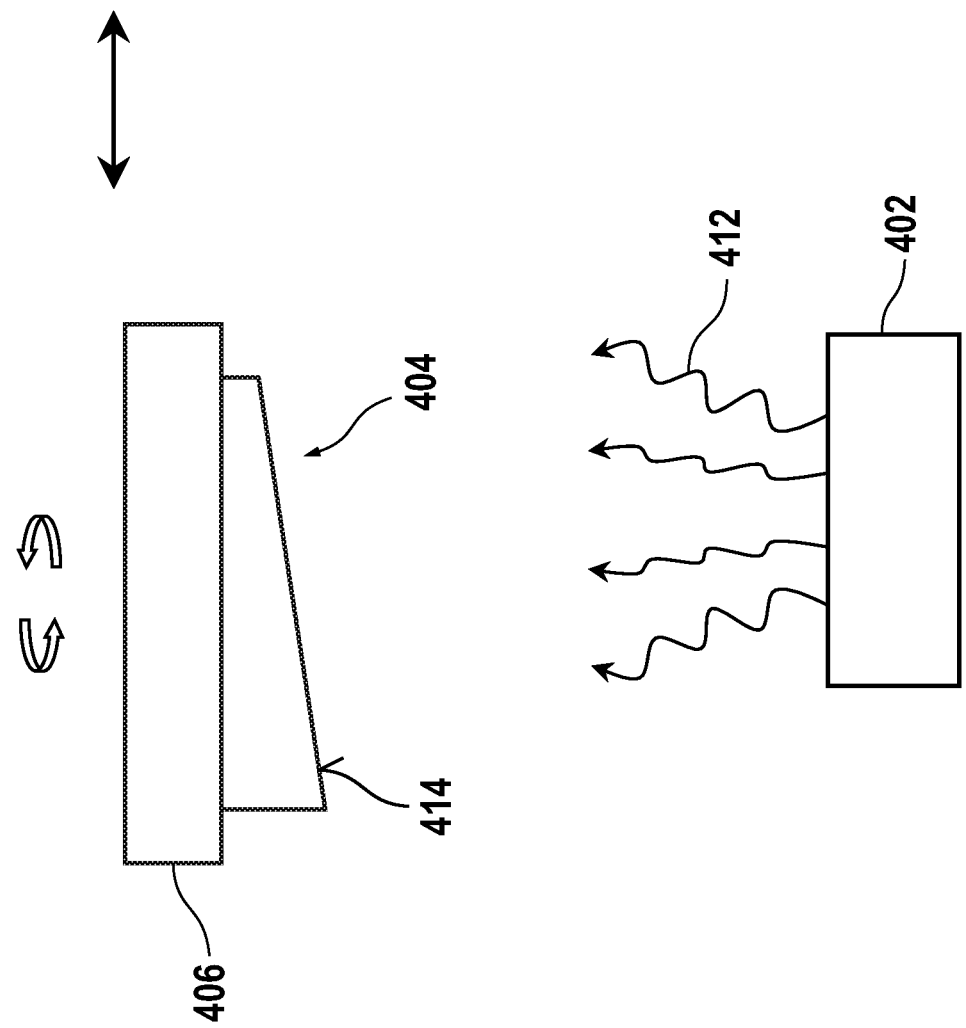
FIG. 4 schematically shows a third embodiment of the apparatus from FIG. 1.

In the embodiment illustrated in FIG. 4 of an apparatus for treating a reflective optical element 404 with holder 406 and radiation source 402 the relative movement between radiation source 402 and reflective optical element 404 is comprised of a superimposition of linear and rotational movements which can be performed by linear and rotary drives (not illustrated) optionally at the holder 406 and/or at the radiation source 402. Thus, even reflective optical elements 404 having asymmetrical surface profiles such as, for example, a chamfer as in the example illustrated in FIG. 4 or other arbitrary freeform profiles can be impinged on by radiation 412 as homogeneously as possible. It should incidentally be pointed out that the geometric arrangement of the apparatus in space is arbitrary. In this regard, in the present example said arrangement is such that the holder 406 is arranged above the radiation source 402, while in the examples explained above the radiation sources are arranged above the respective holders. Other arrangements are also possible, if appropriate with optical elements that deflect the radiation, as long as in particular the reflective coating is impinged on by the radiation.

Figure 5A:
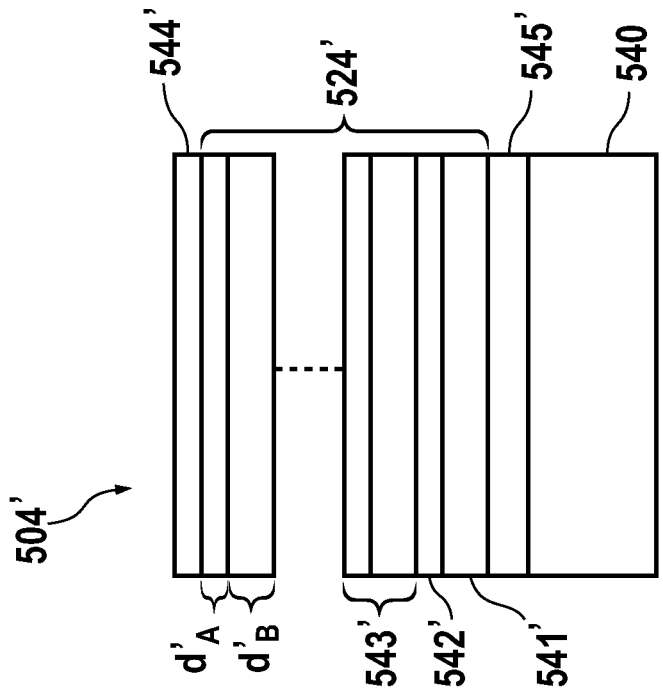
FIG. 5A schematically shows the structure of a reflective optical element for the EUV wavelength range before the artificial ageing.

A reflective optical element for the EUV wavelength range and in particular for EUV lithography or EUV inspection will be explained schematically and by way of example with reference to FIGS. 5A and 5B. FIG. 5A shows the reflective optical element 504 before irradiation, and FIG. 5B after irradiation.

The reflective optical element 504 comprises a multilayer system 524 on a substrate 540. Typical substrate materials for reflective optical elements for EUV lithography or EUV inspection are for example silicon, silicon carbide, silicon-infiltrated silicon carbide, quartz glass, titanium-doped quartz glass and glass ceramic. Furthermore, the substrate can also be composed of metal, for instance copper, aluminium, a copper alloy, an aluminium alloy or a copper-aluminium alloy.

The multilayer system 504 comprises alternatingly applied layers of a material having a higher real part of the refractive index at the operating wavelength at which for example the lithographic exposure is carried out (also called spacer 541) and of a material having a lower real part of the refractive index at the operating wavelength (also called absorber 542), wherein an absorber-spacer pair forms a stack 543. In certain respects a crystal is thereby simulated whose lattice planes correspond to the absorber layers at which Bragg reflection takes place. Reflective optical elements for instance for optical systems for example for an EUV lithography apparatus, an EUV inspection system for wafers or masks or some other optical application are usually designed in such a way that the respective wavelength of maximum peak reflectivity substantially corresponds to the operating wavelength of the lithography or inspection process or other applications of the optical system.

The thicknesses of the individual layers 541, 542 and also of the repeating stacks 543 can be constant over the entire multilayer system 504 or else vary over the area or the total thickness of the multilayer system 504 depending on what spectral or angle-dependent reflection profile or what maximum reflectivity at the operating wavelength is intended to be achieved. The reflection profile can also be influenced in a targeted manner by the basic structure composed of absorber 542 and spacer 541 being supplemented by further more and less absorbent materials in order to increase the possible maximum reflectivity at the respective operating wavelength. To that end, in some stacks absorber and/or spacer materials can be mutually interchanged or the stacks can be constructed from more than one absorber and/or spacer material. Furthermore, it is also possible to provide additional layers as diffusion barriers at the transition from spacer to absorber layers 541, 542 and/or at the transition from absorber to spacer layer 542, 541. With the aid of diffusion barriers, as is known, the reflectivity, even over relatively long periods of time or under the influence of heat, of real multilayer systems can be increased by the reduction of the effect of the density change on account of structural change. Moreover, optionally it is possible to provide a protective layer 544, which can also be of multilayer design, on that side of the multilayer system 524 which faces away from the substrate 540, and also a substrate protective layer 545 between the multilayer system 524 and the substrate 540, which substrate protective layer inter alia can protect the substrate 540 against radiation damage and/or can compensate for layer stresses exerted by the multilayer system 524. These layers 544 and 545 can also be influenced by the treatment.

Most EUV lithography apparatuses or EUV inspection systems are designed for an EUV wavelength of approximately 13.5 nm. A material combination that is customary for example for an operating wavelength of approximately 13.5 nm is molybdenum as absorber material and silicon as spacer material. In this case, in conventional reflective optical elements a stack 55 often has a thickness of ideally approximately 6.7 nm, that is to say half the operating wavelength, wherein the spacer layer 56 is usually thicker than the absorber layer 57. They typically have around 50 stacks.

Figure 5B:
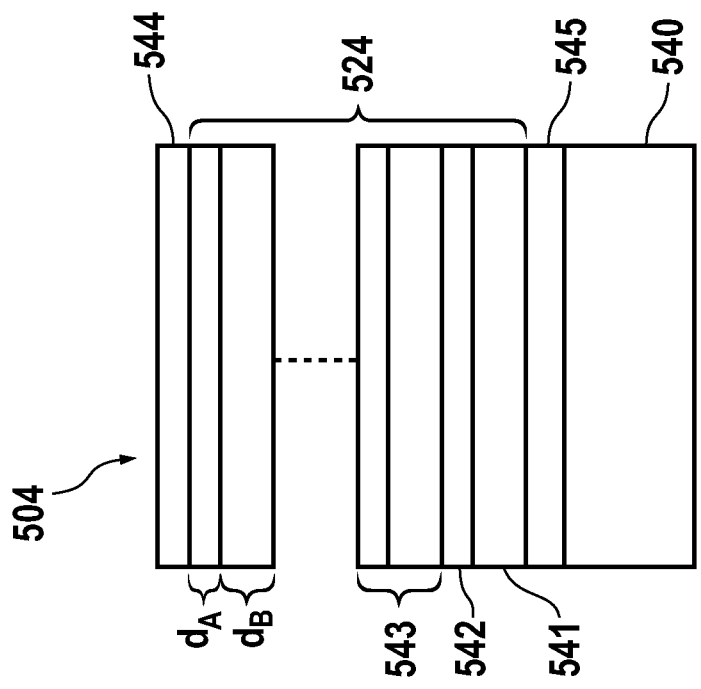
FIG. 5B schematically shows the structure of a reflective optical element for the EUV wavelength range after the artificial ageing.

The reference numerals in FIG. 5B have the same meaning as in FIG. 5A, whereby the elements provided with an apostrophe have a different thickness due to irradiation. The thickness of a spacer layer 541, 541' is designated by $d_B$ or, after irradiation, by $d'_B$, and that of an absorber layer 542, 542' by $d_A$ or $d'_A$. In the majority of chemical and/or physical vapour deposition methods, the applied layers have a structure which has a lower density than that of the corresponding solid composed of the respective material, wherein the actual density can depend on the respective coating method. Under the thermal load during the operation of the reflective optical elements in an EUV lithography apparatus or an EUV inspection system, a densification takes place that can lead to a reduction of the layer thicknesses. The wavelengths of maximum reflectivity with a constant angle of incidence also shift with a change in the layer thickness and hence also stack thickness. Furthermore, wave front aberrations can occur as a result of figure changes. At least partially anticipating the ageing process in the form of a density change, it is possible to reduce drifting of the wavelength of maximum reflectivity and occurrence of wave front aberrations as a result of density change. Since the thermal load is higher for mirrors of an EUV lithography apparatus or of an EUV inspection system that are arranged further at the front in the beam path compared with mirrors arranged further at the back, the correspondingly different drifting can lead to losses of reflectivity.

It should be pointed out that possible structural changes on account of interdiffusion at the layer boundaries are not illustrated in FIG. 5A or 5B, for the sake of better clarity. The interdiffusion is to a first approximation proportional to the root of the time since production of the coating. In the case of molybdenum-silicon multilayer systems, molybdenum silicide, which has a higher density than molybdenum or silicon, would form at the layer boundaries. Consequently, densifications in the individual layers and densifications as a result of the formation of molybdenum silicide can combine to form the phenomenon of compaction.

Moreover, as a result of a short-pulse radiation treatment that operates at the lower end of the energy input into the reflective coating per pulse, it is possible primarily to bring about a relaxation of the layer stress that forms when a multiplicity of layers are applied. To that end, the radiation power can be set to be so low that hardly any densification takes place, but layer stresses resulting from the coating process and the different layer materials relax. It is thus possible to achieve a targeted tensile layer stress change and to dispense with other stress-reducing measures such as additional stress-compensating coatings, for instance, which for their part lead to higher total thicknesses of the coating and aberration faults associated therewith.

Depending on the setting of the radiation power over the pulse duration, if appropriate repetition rate, radiated area, energy density of the radiation source and wavelength or wavelength range, during the artificial ageing it is possible to achieve a compaction for which the thickness of a compacted layer is 0.05% to 0.5% less than the thickness of the still uncompacted layer. When applying the coating, it is possible to provide a corresponding margin for the individual layers.

Particularly in the case of reflective optical elements for the EUV wavelength range, the short-pulse treatment described here has made it possible to achieve the effect that the drift of the wavelength of maximum reflectivity after treatment and during operation over a number of months in an EUV lithography apparatus or an EUV inspection system can be limited to a deviation from the thickness set during the treatment at less than 0.2%.

It was observed that the change in the layer stress after a number of radiation pulses, said number being dependent on the individual case, reaches saturation, such that appreciable changes in the layer stress were no longer measured even in later long-term operation of the reflective optical element for example in an EUV lithography apparatus or an EUV inspection system. The stress at which saturation is reached depends in particular on the energy dose that is input. In the case of compaction, by contrast, given a plurality of constant pulses, a dependence on the root of the number of pulses was observed, such that the irradiation makes it possible to achieve the effect that a subsequent compaction during long-term operation is below a defined tolerance limit.

Reflective optical elements for EUV lithography or EUV inspection comprising reflective coatings comprising a multilayer system as described in association with FIGS. 5A and 5B were subjected to various short-pulse radiation treatments.

A first reflective optical element was irradiated by a xenon flash lamp having a continuous spectrum of between 900 nm and 1100 nm with 10 pulses each having a duration of 300 µs and each having an energy density of 1.5 J/cm². This achieved a compaction of approximately 0.1% relative to the original layer thicknesses and a saturated stress relaxation at a layer stress of approximately 250 MPa.

A second reflective optical element was irradiated by a krypton flash lamp having a continuous spectrum of between 800 nm and 1000 nm with 20 pulses each having a duration of 250 µs and each having an energy density of 1 J/cm². Since the area of the reflective coating of the second reflective optical element was somewhat larger than the area illuminated by the krypton flash lamp, said reflective optical element was moved relative to the krypton flash lamp in order each time to irradiate a different area section and overall to achieve a homogenous irradiation over the entire area of the reflective coating. This likewise lead to a compaction of approximately 0.1% relative to the original layer thicknesses and a saturated stress relaxation at a layer stress of approximately 250 MPa.

A third reflective optical element was irradiated by a xenon flash lamp having a continuous spectrum of between 900 nm and 1100 nm with 10 pulses each having a duration of 350 µs and each having an energy density of 5 J/cm². This achieved a compaction of approximately 1.5% relative to the original layer thicknesses and a slight stress overcompensation of approximately −50 MPa.

A fourth reflective optical element was irradiated by an NdYAG-laser at a wavelength of 106 nm, with a laser power of 20 W and a beam spot of 1 mm². The beam spot swept over the reflective coating at a velocity of 100 cm/s and needed 100 passes, which were laterally offset in each case, in order to scan the entire area of the reflective coating. This corresponds to a power density of 2 kW/cm² or an energy density of 2 J/cm² for a respective duration of 1 ms. This achieved a compaction of approximately 0.2% relative to the original layer thicknesses and a slight stress overcompensation of approximately −100 MPa.

A fifth reflective optical element was irradiated by an NdYAG-laser at a wavelength of 1064 nm, with a laser power of 50 W and a beam spot of 1 mm². The beam spot swept over the reflective coating at a velocity of 50 cm/s and needed 100 passes, which were laterally offset in each case, in order to scan the entire area of the reflective coating. This corresponds to a power density of 6 kW/cm² or an energy density of 3 J/cm² for a respective duration of 2 ms. This achieved a compaction of approximately 1.2% relative to the original layer thicknesses and a slight stress overcompensation of approximately −150 MPa.

REFERENCE SIGNS

100 Coating chamber
102 Radiation source
104 Reflective optical element
106 Holder
108 Linear drive
110 Coating device
202 Halogen flash lamp
204 EUV mirror
206 Holder
212 Radiation
214 Reflective coating
216 Holder surface
302 Short-pulse laser
304 EUV mirror
306 Holder
312 Radiation
314 Reflective coating
316 Holder surface
402 Radiation source
404 EUV mirror
406 Holder
412 Radiation
414 Reflective coating
504, 504' Reflective optical element
524, 524' Reflective coating
540 Substrate
541, 541' Spacer
542, 542' Absorber
543, 543' Stack
544 Protective layer
545 Substrate protective layer
$d_A$, $d'_A$ Thickness
$d_B$, $d'_B$ Thickness

What is claimed is:

1. A method for treating a reflective optical element for an extreme ultraviolet (EUV) wavelength range comprising a reflective coating on a substrate, comprising:
    irradiating the reflective optical element with at least one radiation pulse having a duration of between 1 μs and 1 s, wherein the irradiating is carried out with at least one radiation source and at a wavelength between 800 nm and 1100 nm; and
    moving the at least one radiation source and the reflective optical element relative to one another to perform a relative movement,
    wherein the relative movement is performed with a linear component having a velocity of between 1 cm/s and 600 cm/s adapted at least in part to achieve an artificial ageing of the reflective coating on the substrate with respect to a state of the reflective optical element directly after coating,
    wherein the reflective optical element includes a substrate and a plurality of stacks, each having an absorber-spacer pair,
    wherein saturated stress relaxation of the reflective optical element that was irradiated is approximately 250 MPa or wherein stress overcompensation of the reflective optical element that was irradiated is between −50 MPa to −150 MPa, and
    wherein compaction of at least one layer of the reflective optical element is approximately 0.1 to 1.5% relative to an original layer thickness.

2. The method according to claim 1, wherein the relative movement is further performed as a superimposition of at least one linear movement and at least one rotational movement.

3. The method according to claim 1, wherein the at least one radiation pulse is directed onto the reflective coating.

4. The method according to claim 1, wherein the irradiating is performed with at least one radiation pulse having an energy density of between 0.01 J/cm² and 15 J/cm².

5. A method for producing a reflective optical element for EUV lithography comprising a reflective coating on a substrate, comprising:
    coating the substrate; and
    treating the coated substrate according to the method claimed in claim 1.

6. The method according to claim 5, wherein the coating of the substrate is performed in a coating chamber, and wherein the treating is performed in the coating chamber.

7. The method according to claim 5, wherein both the coating and the treating are performed under vacuum or protective atmosphere.

8. The method according to claim 5, wherein the treating is performed directly after the coating.

9. The method according to claim 1, wherein the radiation source is operated with varying power depending on the relative movement.

10. The method according to claim 1, wherein the irradiating is performed with at least one radiation pulse having an energy density of between 0.01 J/cm² and 5 J/cm².

11. The method according to claim 1, wherein the irradiating is performed with at least one radiation pulse having a duration of between 250 μs to 2 ms.

12. The method according to claim 1, wherein the at least one radiation source is operated in a pulsed manner with a pulse duration between 100 μs and 500 μs and an energy density between 0.01 J/cm² and 15 J/cm², wherein the pulse duration and the energy density is set based on a desired stress relaxation of at least one layer of the optical element and wherein the energy density is set to increase homogenous ageing.

13. The method according to claim 1, wherein the velocity is between 10 cm/s to 200 cm/s.

14. The method according to claim 1, wherein the irradiation source has a radiation spot size of 1 mm² to 1 cm², is operated at a power of 5 W to 500 W, and passes through 1 to 1000 cycles in a pulsed operation at a repetition rate of approximately 0.1 Hz to 1000 Hz.

15. The method according to claim 1, wherein the velocity of the linear component is adapted at least in part to achieve densification of individual layers of the reflective optical element in comparison to the state of the reflective optical element directly after coating and the artificial ageing including density changes and saturated stress relaxation.

16. The method according to claim 1, wherein the velocity of the linear component is adapted at least in part to achieve one or more structural changes of the reflective optical element on account of interdiffusion at layer boundaries of the reflective optical element.

\* \* \* \* \*